United States Patent
Nienhuys (10) Patent No.: US 9,846,365 B2
(45) Date of Patent: Dec. 19, 2017

(54) COMPONENT FOR A RADIATION SOURCE, ASSOCIATED RADIATION SOURCE AND LITHOGRAPHIC APPARATUS

(71) Applicant: ASML Netherlands B.V., Veldhoven (NL)

(72) Inventor: Han-Kwang Nienhuys, Utrecht (NL)

(73) Assignee: ASML Netherlands B.V., Veldhoven (NL)

(*) Notice: Subject to any disclaimer, the term of this patent is extended or adjusted under 35 U.S.C. 154(b) by 34 days.

(21) Appl. No.: 14/901,941

(22) PCT Filed: Jun. 17, 2014

(86) PCT No.: PCT/EP2014/062686
§ 371 (c)(1),
(2) Date: Dec. 29, 2015

(87) PCT Pub. No.: WO2015/014531
PCT Pub. Date: Feb. 5, 2015

(65) Prior Publication Data
US 2016/0377985 A1    Dec. 29, 2016

Related U.S. Application Data

(60) Provisional application No. 61/861,663, filed on Aug. 2, 2013.

(51) Int. Cl.
*G03B 27/54* (2006.01)
*G03F 7/20* (2006.01)
*H05G 2/00* (2006.01)

(52) U.S. Cl.
CPC ...... *G03F 7/70033* (2013.01); *G03F 7/70916* (2013.01); *H05G 2/006* (2013.01); *H05G 2/008* (2013.01); *H05G 2/005* (2013.01)

(58) Field of Classification Search
CPC ............ G03F 7/70033; G03F 7/70916; H05G 2/005; H05G 2/006; H05G 2/008
(Continued)

(56) References Cited

U.S. PATENT DOCUMENTS 7,332,731 B2    2/2008    Klunder et al.
7,541,603 B2    6/2009    Van Herpen et al.
(Continued)

FOREIGN PATENT DOCUMENTS

CN    101322078 A    12/2008
CN    101583909 A    11/2009
(Continued)

OTHER PUBLICATIONS

International Search Report and Written Opinion of the International Search Authority directed to related International Patent Application No. PCT/EP2014/062686, dated Oct. 14, 2014; 10 pages.
(Continued)

*Primary Examiner* — Peter B Kim
(74) *Attorney, Agent, or Firm* — Sterne, Kessler, Goldstein & Fox P.L.L.C.

(57) ABSTRACT

Disclosed is component for a radiation source, said radiation source being operable to generate radiation from a fuel, said component having a surface comprising a plurality of first regions that have a high wettability by said fuel, separated by second regions which have a low wettability by said fuel. Said component may comprise a screening element for a droplet generator or contamination trap, for example.

18 Claims, 4 Drawing Sheets

(58) Field of Classification Search
USPC .......................................................... 355/67
See application file for complete search history.

(56) References Cited

U.S. PATENT DOCUMENTS

| | | | |
|---|---|---|---|
| 8,755,032 B2 | 6/2014 | Yakunin et al. | |
| 2005/0111080 A1 | 5/2005 | Bakker et al. | |
| 2006/0192154 A1 | 8/2006 | Algots et al. | |
| 2009/0014030 A1 | 1/2009 | De Jong et al. | |
| 2011/0181848 A1 | 7/2011 | Metzmacher et al. | |
| 2011/0248191 A1 | 10/2011 | Fomenkov et al. | |
| 2011/0253913 A1 | 10/2011 | Nagai et al. | |
| 2012/0205559 A1* | 8/2012 | Yabu ..................... | H05G 2/006 250/504 R |
| 2013/0134326 A1 | 5/2013 | Yabu et al. | |

FOREIGN PATENT DOCUMENTS

| | | |
|---|---|---|
| CN | 102144191 A | 8/2011 |
| EP | 1526550 A1 | 4/2005 |
| EP | 2157481 A2 | 2/2010 |

OTHER PUBLICATIONS

International Preliminary Report on Patentability directed to related International Patent Application No. PCT/EP2014/062686, issued Feb. 2 2016; 7 pages.

\* cited by examiner

COMPONENT FOR A RADIATION SOURCE, ASSOCIATED RADIATION SOURCE AND LITHOGRAPHIC APPARATUS

CROSS-REFERENCE TO RELATED APPLICATIONS

This application claims the benefit of U.S. provisional application 61/861,663 which was filed on 2 Aug. 2013, and which is incorporated herein in its entirety by reference.

FIELD

The present invention relates generally lithography, and more particularly to a component for a radiation source, such as an EUV (or shorter wavelength) radiation source.

BACKGROUND

Extreme ultraviolet (EUV) radiation is electromagnetic radiation having a wavelength within the range of 5-20 nm, and may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored (normal incidence or grazing incidence) radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

One application of an EUV radiation source is in lithography. A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In order to reduce the minimum printable size, imaging may be performed using radiation having a short wavelength. It has therefore been proposed to use an EUV radiation source providing EUV radiation within the range of 13-14 nm, for example. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation.

Many of the surfaces within an EUV radiation source are susceptible to contamination by fuel debris. This fuel debris can collect on these surfaces and, after time, can flow onto or drop onto the collector, ultimately resulting in a loss of source output efficiency and power.

SUMMARY

It is desirable to reduce the amount of contamination of surfaces by fuel within the source.

The invention in a first aspect provides a component for a radiation source, said radiation source being operable to generate radiation from a fuel, said component having a surface comprising a plurality of first regions that have a high wettability by said fuel, such as liquid tin, separated by second regions that have a low wettability by said fuel.

The second material may be a metallic material having a melting point in excess of 750 degrees celsius.

The component may be embodied as a screening element for protecting droplets of fuel from a gas flow within the source, said screening element comprising the at least one surface having a plurality of first regions which have a high wettability for the fuel, separated by second regions which have a low wettability by the fuel. The screening element may include a substantially curved form.

Regions of high wettability may be defined as those for which the contact angle of the fuel on the material surface is less than 45 degrees. Regions of low wettability may be defined as those for which the contact angle of the fuel on the material surface is greater than 90 degrees. Regions of low wettability may be defined as those for which the contact angle of the fuel on the material surface is greater than 135 degrees.

The component may include heating elements for heating the component to a temperature sufficient to evaporate the fuel. The temperature may be in excess of 750 degrees celsius.

The first regions each may have a dimension less than 5 mm in the vertical direction, wherein said vertical direction is the direction in which the gravitational force acts on the component.

The first regions each may have a dimension less than 2 mm in the vertical direction, wherein said vertical direction is the direction in which the gravitational force acts on the component.

The first regions each may have a dimension less than 20 mm or less than 10 mm in the horizontal direction.

The invention in a second aspect provides for a radiation source comprising: a droplet generator for providing droplets of fuel to a plasma generation site, a radiation collector for collecting and focusing radiation generated by a plasma following excitation of said fuel droplet at said plasma generation site; and a component according to the first aspect of the invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which:

FIGS. 5(*a*), 5(*b*), 5(*c*) and 5(*d*) illustrate possible causes of fuel debris contamination on the collector that may be encountered using the source arrangement of FIG. 4;

FIGS. 7(*a*) and 7(*b*) illustrate a screening element according to an embodiment of the invention, which may be used in place of the shroud illustrated in the source arrangement of FIG. 4.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
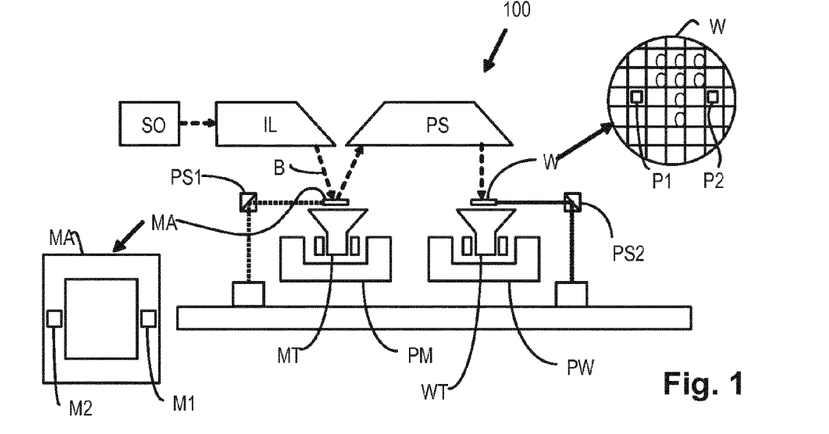
FIG. 1 depicts schematically a lithographic apparatus having reflective projection optics.

FIG. 1 schematically depicts a lithographic apparatus 100 including a source module SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
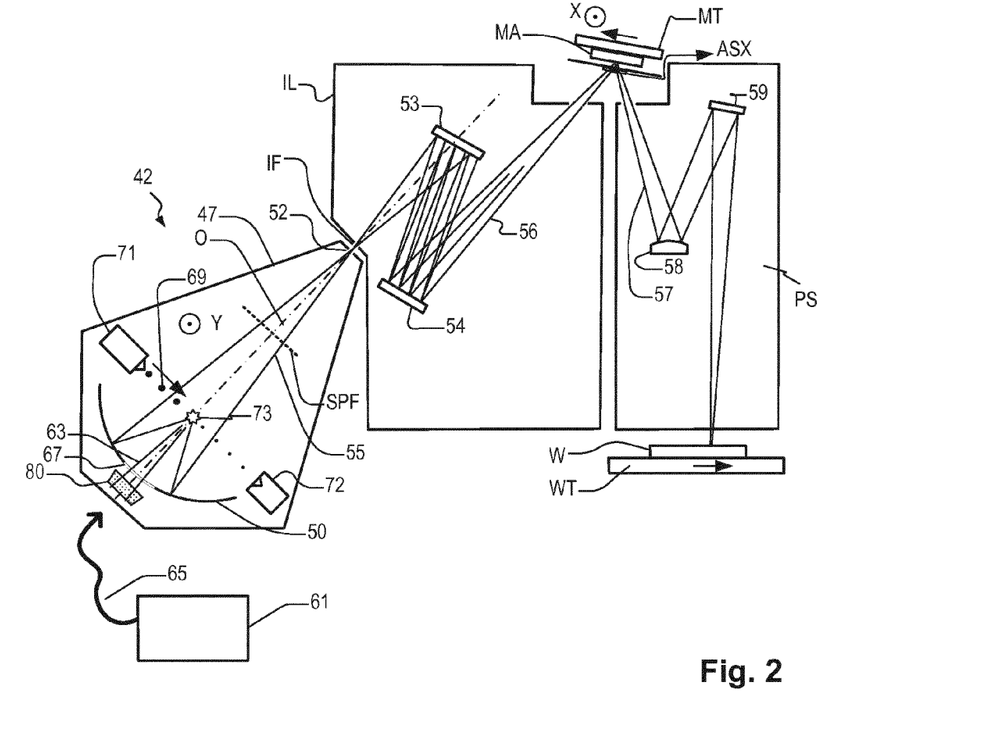
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector 50 which, in the example of FIG. 2, is a normal-incidence collector, for instance a multi-layer mirror.

As part of an LPP radiation source, a laser system 61 is constructed and arranged to provide a laser beam 63 that is delivered by a beam delivering system 65 through an aperture 67 provided in the collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply (e.g., droplet generator) 71 in the form of droplets. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several 10's of eV. Higher energy EUV radiation may be generated with other fuel materials, for example Tb and Gd. The energetic radiation generated during de-excitation and recombination of these ions includes the wanted EUV that is emitted from the plasma at position 73. The plasma formation position 73 is located at a first focal point of collector 50 and the EUV radiation is focused by the normal-incidence collector mirror 50, through aperture 52, onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56 onto a patterning device (e.g., reticle or mask) positioned on a support (e.g., reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR radiation present from the laser beam 63. The non-EUV wavelengths are not wanted in the illumination system IL and projection system PS and various measures may be deployed to block the non-EUV radiation. As schematically depicted in FIG. 2, a transmissive Spectral Purity Filter SPF may be applied upstream of the virtual source point IF. Alternatively or in addition to such a filter, filtering functions can be integrated into other optics. For example a diffractive filter can be integrated in collector 50 and/or mirrors 53, 54 etc., by provision of a grating structure tuned to divert the longer, IR radiation away from the virtual source point IF. Filters for IR, DUV and other unwanted wavelengths may thus be provided at one or more locations along the paths of beams 55, 56, 57, within source module (radiation system 42), the illumination system IL and/or projection system PS.

To deliver the fuel, which for example is liquid tin, a droplet generator or target material supply 71 is arranged within the source chamber 47, to fire a stream of droplets towards the plasma formation position 73. In operation, laser beam 63 may be delivered in a synchronism with the operation of target material supply 71, to deliver impulses of radiation to turn each fuel droplet into a plasma. The frequency of delivery of droplets may be several kilohertz, or even several tens or hundreds of kilohertz. In practice, laser beam 63 may be delivered by a laser system 61 in at least two pulses: a pre pulse with limited energy is delivered to the droplet before it reaches the plasma location, in order to vaporize the fuel material into a small cloud, and then a main pulse of laser energy is delivered to the cloud at the desired location, to generate the plasma. In a typical example, the diameter of the plasma is about 2-3 mm. A fuel trap 72 is provided on the opposite side of the enclosing structure 47, to capture fuel that is not, for whatever reason, turned into plasma.

A problem that can arise in the LPP source apparatus is that optical elements of the laser beam deliver system 65 will become contaminated with debris from the plasma. In particular a final optical element, be it a lens or a mirror, is directly exposed to particles of fuel ejected from the plasma. A refractive element will quickly become obscured by tin deposits, leading to reduced transmission of the laser radiation and undesired heating. A reflective final element, such as a copper mirror, may be more tolerant of Sn deposits for time, but will need cleaning eventually to maintain efficiency of reflection and focusing.

In order to block as much contamination as possible, a contamination trap 80 of some sort may be provided between the plasma formation site 73 and optical elements of the beam delivery system 65. A so-called foil trap is known for use in such cases. The trap may be a static or a rotating foil trap, or a combination of both. The rotating foil trap (RFT), as is known in the art, comprises a number of thin vanes aligned with the radiation direction so as to present as little obstruction to the wanted radiation beam. The vanes extend in length parallel to the beam direction, and extend radially from the optical axis (O). When the foils rotate about the optical axis O, slower-moving contaminant particles are caught by the sweeping motion of the vanes.

Figure 3:
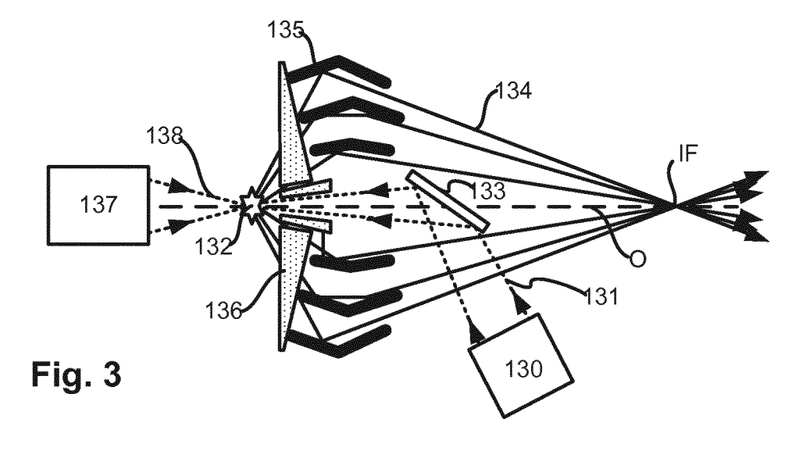
FIG. 3 shows an alternative source arrangement usable in the apparatus of FIG. 2.

FIG. 3 shows an alternative LPP source arrangement that may be used in place of that illustrated in FIG. 2. A main difference is that the main pulse laser beam is directed onto the fuel droplet from the direction of the intermediate focus point IF, such that the collected EUV radiation is that which is emitted generally in the direction from which the main laser pulse was received.

FIG. 3 shows the main laser beam delivery system 130 emitting a main pulse beam 131 delivered to a plasma formation position 132. At least one optical element of the beam delivery system, in this case a folding mirror 133 is located on the optical axis between plasma position 132 and the intermediate focus. (The term "folding" here refers to folding of the beam, not folding of the mirror.) The EUV radiation 134 emitted by a plasma at position 132, or at least the major portion that is not directed back along the optical axis O into the folding mirror 133 is collected by a grazing incidence collector 135. This type of collector is known already, but is generally used in discharge produced plasma (DPP) sources, not LPP sources. Also shown is a contamination trap 136. A pre-pulse laser 137 is provided to deliver a pre-pulse laser beam 138 to fuel droplets. In this example, the pre-pulse energy is delivered to the side of the fuel droplet that faces away from the intermediate focus point IF. It should be understood that the elements shown in this schematic diagram are not to scale.

Figure 4:
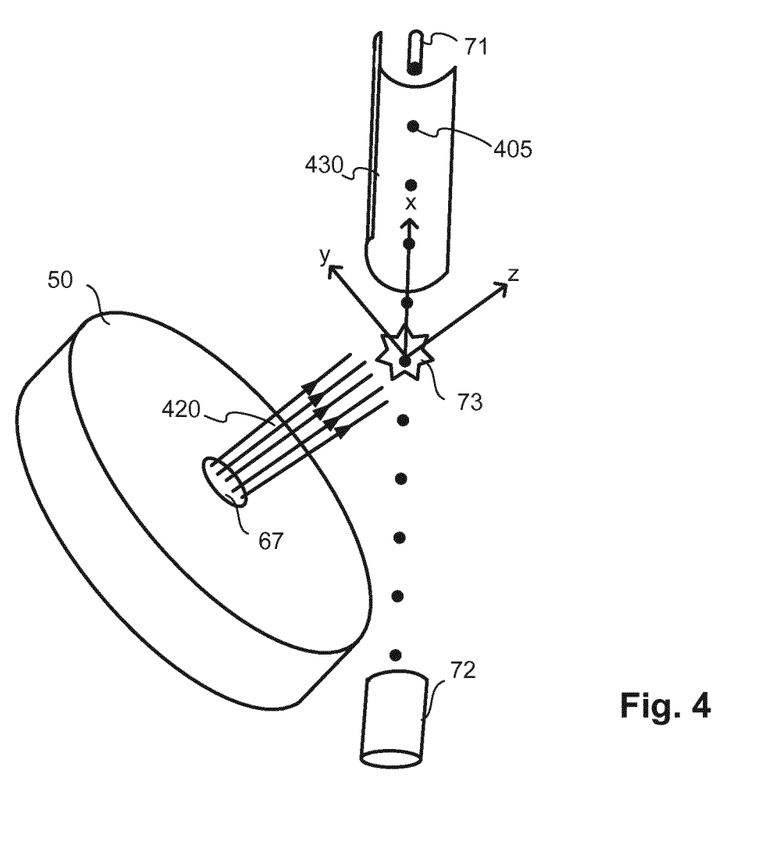
FIG. 4 shows a source arrangement illustrating aspects of fuel debris contamination mitigation on the collector.

FIG. 4 shows a source arrangement in greater detail. It shows the droplet generator 400 delivering droplets of fuel 405 to plasma formation position 73. Unspent fuel is caught by fuel catcher 72, thereby preventing the caught fuel from contaminating other surfaces within the source, in particular the collector 50. To further protect the collector surface from fuel contamination, a gas flow 420 is established away from the collector surface. Fuel debris that might have otherwise contaminated the collector 50 surface is swept away by this gas flow 420. The gas flow 420 is shown here being established through the collector aperture 67, through which the laser radiation travels for exciting the fuel droplet 405 to form a plasma. A screening element 430, hereafter referred to as a shroud, may be provided at the droplet generator 400 nozzle. This acts to protect the fuel droplets 405 from being disturbed by the gas flow 420 prior to their excitation by the laser radiation.

A contamination trap (not shown) may also be provided for capturing debris. Such contamination traps may take many forms, such as comprising a number of radially extending foils or plates, onto the surface of which fuel may collide and be captured. They may be located, for example, between the fuel source and collector, or around the inside walls of the source chamber 47 (FIG. 2).

In operation, the source components, such as a contamination trap or a shroud (e.g., shroud 430) may become covered in a significant amount of liquid tin, which presents a risk of collector 50 contamination. In order to mitigate this, such components may be heated (for example up to a temperature of 750° C. or more) in order to evaporate tin deposits. Alumina (aluminum oxide ceramic) has been identified as a suitable material for such components, particularly shroud 430, due to its resistance to high temperatures and the chemical environment.

Figure 5A:
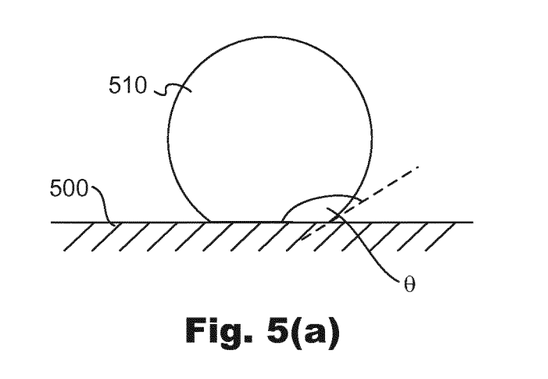
Figure 5B:
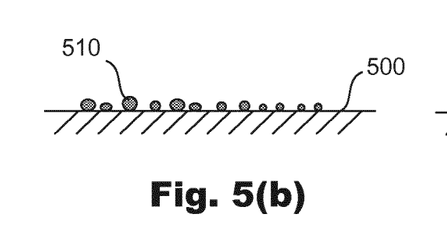
Figure 5C:
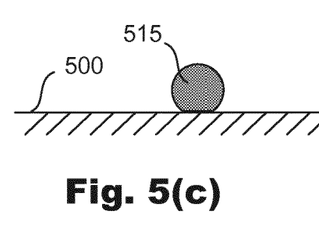
Figure 5D:
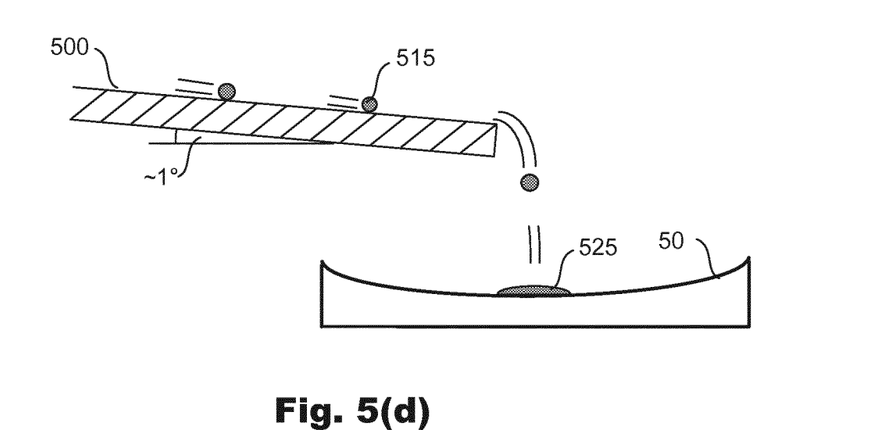

FIGS. 5(a), 5(b), 5(c) and 5(d) illustrate some of the problems in which may be encountered with such an arrangement, without tungsten coating. Alumina 500 is not wettable by liquid tin 510, the liquid tin 510 having a contact angle θ on alumina greater than 158 degrees according to the paper "Surface Tension and Its Temperature Coefficient of Molten Tin Determined with the Sessile Drop Method at Different Oxygen Partial Pressures," Z. F. Yuan et al. Journal of Colloid and Interface Science 254, 338-345 (2002), which is hereby incorporated by reference. This is illustrated in FIG. 5(a). This means that tin deposits 510 tend not to stick to the alumina surface 500 (the sliding angle depends on droplet size and wettability of the surface) but sit on the surface as is shown in FIG. 5(b). Consequently over time these tin deposits 510 tend to accumulate into large droplets 515, such as that shown in FIG. 5(c), with a surface/volume ratio that is unfavorable for rapid evaporation. The accumulated tin may start flowing along even very small slopes (e.g., on the order of 1 degree or less). Such flowing tin deposits 515 can lead to severe contamination 525 of the collector 50. This is illustrated in FIG. 5(d). Even if the tin deposits do not fall on the collector, they can pool at the lowest point, resulting in an even more unfavorable surface to volume ratio. In addition to this, tin deposits have a low thermal emissivity compared to alumina, which can lead to large temperature gradients in the heated component material. Such temperature gradients can reduce the lifetime of components such as shroud 430 (mechanical stress and degradation at higher temperatures).

Figure 6:
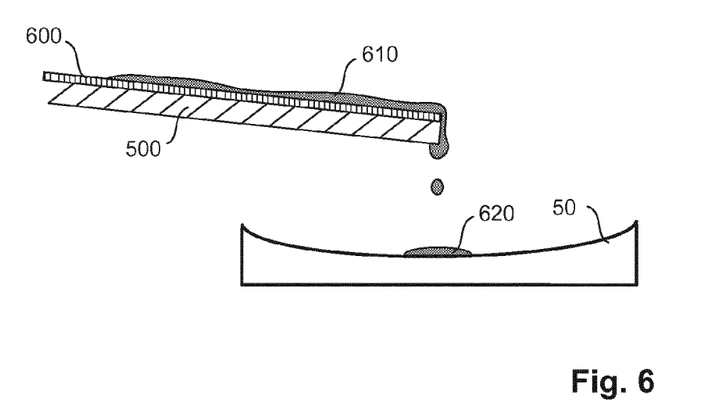
FIG. 6 illustrates a possible cause of fuel debris contamination on the collector that may be encountered using the source arrangement of FIG. 4, having a coated surface therein.

A metallic coating, e.g., tungsten, can be applied to the alumina surface. If the alumina surface 500 is covered with a wettable coating 600, such as tungsten or molybdenum, the problems of both the low surface/volume ratio and the differences in thermal emissivity can be reduced. However, it is still possible that large deposits 610 start flowing, possibly resulting in collector contamination 620. This is illustrated in FIG. 6.

Figure 7A:
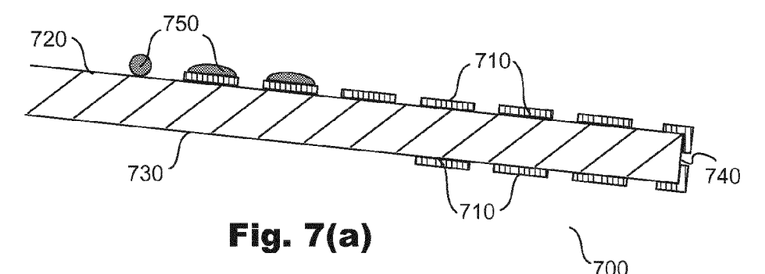
Figure 7B:
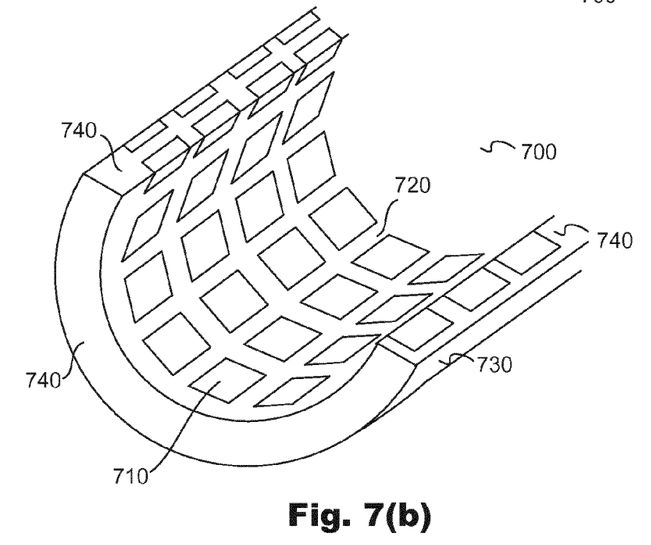

FIGS. 7(a) and 7(b) illustrate a shroud arrangement 700 in cross section (FIG. 7(a)) and perspective (FIG. 7(b)) views, which mitigates the issues described above. It shows a wettable coating (e.g., tungsten or molybdenum) applied to the shroud's surface in isolated regions 710 or "islands". Separating the isolated regions of wettable coating 710 are corridors of uncoated shroud (e.g., uncoated alumina). These regions of wettable coating 710 may be applied to the inside surface 720 of the shroud only. Application of isolated regions of wettable coating 710 with uncoated regions therebetween may be to the whole surface 720, or part thereof. Alternatively, as illustrated here, these regions 710 may be applied to both the inside surface 720 (whole or part) and outside surface 730 (whole or part) of the shroud. Optionally, regions of wettable coating 710 may also be applied to any of the edge faces 740. In other words, any part of the shroud's outer surface may be covered in these regions of wettable coating 710 alternating with uncoated regions.

Applying the wettable coating 710 in this manner helps prevent tin from flowing along the shroud surface, while maximizing the surface-to-volume ratio of tin deposits on the shroud surface. As a result, faster evaporation of the tin deposits 750 can be achieved by heating of the shroud 700, while reducing the risk of collector contamination caused by liquid fuel running off the shroud before evaporation.

The sizes of these wettable regions 710 will have an impact on their effectiveness, with there being a trade-off between having larger or smaller regions. Small wettable regions 710 will help ensure that fuel is distributed uniformly over the entire wettable region; however should a large droplet fall onto such a small wettable region, it will be forced into a spherical shape with an unfavorable surface/volume ratio. Large wettable regions can lead to accumulation near the edge of the wettable region, if the wettable region is not horizontal. In particular embodiments, the wettable regions may have dimension no larger than 4 mm, 2 mm or 1 mm in the vertical direction (this being the direction in which the gravitational force acts on the component) and no larger than 20 mm, 10 mm or 5 mm in the horizontal direction. Since the shroud is curved, this will lead to wettable region shapes that vary in size depending on their location.

While the wettable coating is described herein as being tungsten or molybdenum, other materials, possibly metallic, may be used provided they are sufficiently wettable by the fuel material (e.g., tin). At its broadest, sufficiently wettable materials may be those for which the contact angle of the fuel on the material surface, shows some improvement over 158 degrees. In some embodiments, wettable materials may be defined as being those for which the contact angle of the fuel on the material surface is less than 120 degrees, less than 90 degrees, or less than 45 degrees. The intervening non-wettable regions, described herein as being alumina, may comprise any suitable material having low wetabillity. Such materials may be those for which the contact angle of the fuel on the material surface is greater than 90 degrees. In other embodiments, non-wettable materials may be defined as being those for which the contact angle of the fuel on the material surface is greater than 60 degrees or greater than 135 degrees. Of course, the materials chosen should also be able to withstand the temperatures to which the shroud may be heated.

Generally, tin-wettable metals are metals that do not have an oxide layer at the surface. Other examples could be silver and gold; by comparison, stainless steel is very much non-wettable.

The general concept of having surface regions of fuel wettable material separated by regions of non-fuel wettable material, as disclosed above in relation to the shroud, is generally applicable to other elements or components within the source, possibly in combination with heating of that element. Any element for which it is desirable to expedite evaporation of fuel deposits from its surface may be so treated. Such elements or components may include a debris capturing component such as the contamination trap shown in FIG. 3, or other debris contamination mitigation component or the inner surface of the source walls, for example.

While the above disclosure is described in relation to a particular LPP source arrangement, it should be appreciated that the concepts taught herein are applicable to any LPP source (including all those mentioned in this specification), and possibly to other types of plasma radiation source (e.g., DPP), which may be affected by one or more of the fuel deposition issues illustrated in FIG. 5 or 6.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A component for a radiation source, said radiation source being operable to generate radiation from a fuel, such as liquid tin, the component comprising:
   at least one surface comprising first regions that have a high wettability for the fuel, wherein the first regions are separated by second regions that have a low wettability for the fuel, and
   wherein the at least one surface is configured to capture fuel debris within the radiation source and expedite evaporation of the captured fuel thereby reducing contamination of a radiation collector mirror.

2. The component as claimed in claim 1, further configured as a screening element that protects droplets of fuel from a gas flow within the source, wherein said screening element comprises said at least one surface having the first regions separated by the second regions.

3. The component as claimed in claim 2, wherein an inside surface of said screening element comprises said first regions separated by said second regions, said inside surface being adjacent the fuel droplets.

4. The component as claimed in claim 3, wherein an outside surface of said screening element comprises said first regions separated by said second regions, said outside surface being opposite the inside surface.

5. The component as claimed in claim 3, wherein one or more edge surfaces of said screening element comprise said first regions.

6. The component as claimed in claim 2, wherein one or more edge surfaces of said screening element comprise said first regions.

7. The component as claimed in claim 1, wherein regions of high wettability are defined as those for which the contact angle of the fuel on the material surface is less than 90 degrees.

8. The component as claimed in claim 1, wherein said component is substantially comprised of a first material that has a low wettability by said fuel, and wherein said first regions comprise regions of a second material applied to the surface of said first material, and said second regions comprise uncovered regions of said first material.

9. The component as claimed in claim 8, wherein said second material is of a type that does not form an oxide layer on its surface during operation, for the operating conditions under which it operates.

10. The component as claimed in claim 1, wherein said second material is a metallic material having a melting point in excess of 750 degrees celsius, such as tungsten or molybdenum.

11. The component as claimed in claim 1, comprising heating elements for heating the component to a temperature sufficient to evaporate the fuel.

12. A radiation source comprising:
   a droplet generator configured to provide droplets of fuel to a plasma generation site;
   a radiation collector configured to collect and focus radiation generated by a plasma following excitation of said fuel droplet at said plasma generation site; and
   one or more components comprising at least one surface comprising first regions that have a high wettability for the fuel, wherein the first regions are separated by second regions that have a low wettability for the fuel, and
   wherein the at least one surface is configured to capture fuel debris within the radiation source and expedite evaporation of the captured fuel thereby reducing contamination of the radiation collector.

13. The radiation source as claimed in claim 12, wherein said radiation generated by the plasma is radiation having a wavelength less than 20 nm.

14. The radiation source as claimed in claim 12, wherein said one or more components are located parallel to a path, or a portion thereof, taken by a droplet between the droplet generator and the plasma generation site such that they are adjacent an output of said droplet generator and between a source of said gas flow and said droplet path.

15. The radiation source as claimed in claim 12, wherein said component is located parallel to a path, or a portion thereof, taken by a droplet between the droplet generator and the plasma generation site such that it is adjacent an output of said droplet generator and between a source of said gas flow and said droplet path.

16. A lithographic apparatus comprising:
   a radiation source comprising:
   a droplet generator configured to provide droplets of fuel to a plasma generation site;
   a radiation collector configured to collect and focus radiation generated by a plasma following excitation of said fuel droplet at said plasma generation site; and
   one or more components comprising at least one surface comprising first regions that have a high wettability for the fuel, wherein the first regions are separated by second regions that have a low wettability for the fuel, and wherein the at least one surface is configured to capture fuel debris within the radiation source and expedite evaporation of the captured fuel thereby reducing contamination of the radiation collector, and wherein the lithographic apparatus is configured to use the radiation generated by the radiation source in a lithographic process to form a structure on a target portion of a substrate.

17. The lithographic apparatus of claim 16, wherein said radiation generated by the plasma is radiation having a wavelength less than 20 nm.

18. The lithographic apparatus of claim 16 wherein said one or more components are located parallel to a path, or a portion thereof, taken by a droplet between the droplet generator and the plasma generation site such that they are adjacent an output of said droplet generator and between a source of said gas flow and said droplet path.

* * * * *